(12) United States Patent
Kurushima

(10) Patent No.: US 11,012,046 B2
(45) Date of Patent: May 18, 2021

(54) RADIO TRANSMITTER

(71) Applicant: JVCKENWOOD Corporation, Yokohama (JP)

(72) Inventor: Nobuyoshi Kurushima, Yokohama (JP)

(73) Assignee: JVCKENWOOD Corporation, Yokohama (JP)

(*) Notice: Subject to any disclaimer, the term of this patent is extended or adjusted under 35 U.S.C. 154(b) by 97 days.

(21) Appl. No.: 16/459,931

(22) Filed: Jul. 2, 2019

(65) Prior Publication Data

US 2020/0067471 A1 Feb. 27, 2020

(30) Foreign Application Priority Data

Aug. 22, 2018 (JP) .............................. JP2018-155384

(51) Int. Cl.
| | |
|---|---|
| *H03G 3/30* | (2006.01) |
| *H03G 3/10* | (2006.01) |
| *H03G 1/00* | (2006.01) |
| *H03F 1/32* | (2006.01) |
| *H03F 3/45* | (2006.01) |

(52) U.S. Cl.
CPC ............ *H03G 3/10* (2013.01); *H03F 1/3211* (2013.01); *H03F 3/45071* (2013.01); *H03G 1/0023* (2013.01)

(58) Field of Classification Search
CPC ........... H03G 3/20; H03G 3/30; H03G 3/3036

USPC ............................... 330/141, 281; 455/127.2
See application file for complete search history.

(56) References Cited

U.S. PATENT DOCUMENTS 5,304,947 A * 4/1994 Carlsson .............. H03G 3/3047
330/279

FOREIGN PATENT DOCUMENTS

JP 2006-216995 A 8/2006

* cited by examiner

*Primary Examiner* — Steven J Mottola
(74) *Attorney, Agent, or Firm* — Procopio, Cory, Hargreaves & Savitch LLP

(57) ABSTRACT

In a gain control device, a gain control voltage adjust circuit includes a time-constant circuit and outputs an adjusted gain control voltage depending on an adjustment signal and a control voltage generated by a differential amplifier upon input of the adjustment signal. An adjustment signal generation circuit outputs the adjustment signal during an adjustment signal output period. This period is a specified period before a first burst signal is output from a signal output unit and where a burst signal is not output from the signal output unit. The adjustment signal is to make the adjusted gain control voltage closer to a target voltage. The target voltage is a gain control voltage output from the gain control voltage adjust circuit and corresponding to a steady part of a second burst signal. The second burst signal is a burst signal output before the first burst signal.

6 Claims, 13 Drawing Sheets

RADIO TRANSMITTER

CROSS REFERENCE TO RELATED APPLICATION

This application is based upon and claims the benefit of priority from Japanese patent application No. 2018-155384, filed on Aug. 22, 2018, the disclosure of which is incorporated herein in its entirety by reference.

BACKGROUND

The present invention relates to a radio transmitter.

There is a radio transmitter including a circuit that controls transmission power to specified target power. For example, an automatic gain control device of a radio transmitter is disclosed in Japanese Unexamined Patent Application Publication No. 2006-216995. The automatic gain control device stores an output voltage of a DC (direct-current) amplifier immediately before the falling edge of a high-frequency burst signal, and supplies it to a time-constant circuit at the rising edge of the next high-frequency burst signal. Then, the output of the time-constant circuit is used as a gain control voltage. The automatic gain control device updates the stored voltage by the output voltage of the DC amplifier at each rising edge of the high-frequency burst signal.

SUMMARY

The output voltage of the DC amplifier (i.e., the input of the time-constant circuit) has a quick response to antenna load change. Thus, there is a possibility that the tendency of variation in the output voltage of the DC amplifier and the tendency of variation in the output voltage of the time-constant circuit do not necessarily match. Therefore, even if the output voltage of the DC amplifier is stored immediately before the falling edge of the high-frequency burst signal and supplied to the time-constant circuit at the rising edge of the next high-frequency burst signal, there is a possibility that a suitable gain control voltage cannot be obtained when transmitting the next high-frequency burst signal.

A radio transmitter according to one aspect includes a modulator configured to output a burst signal, a variable gain amplifier configured to amplify the burst signal with a gain depending on a gain control voltage and output the amplified burst signal, a differential amplifier configured to generate a control voltage depending on a difference between actual transmission power and target transmission power of a radio signal, a gain control voltage adjust circuit configured to include a time-constant circuit and output a gain control voltage depending on the control voltage to the variable gain amplifier, and an adjustment signal generation circuit configured to generate an adjustment signal based on the gain control voltage that is output when a second burst signal output before a first burst signal is output from the modulator is output from the modulator, and output the generated adjustment signal to the gain control voltage adjust circuit during a specified period which is before the first burst signal is output from the modulator and during which no burst signal is output from the modulator, in which the gain control voltage adjust circuit outputs the gain control voltage depending on the generated control voltage when the adjustment signal is not input, and outputs the gain control voltage depending on the adjustment signal when the adjustment signal is input.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments of the present invention are described hereinafter with reference to the drawings. It should be noted that the same elements are denoted by the same reference symbols, and the redundant explanation thereof is omitted.

First Embodiment

<Configuration Example of Radio Transmitter>

Figure 1:
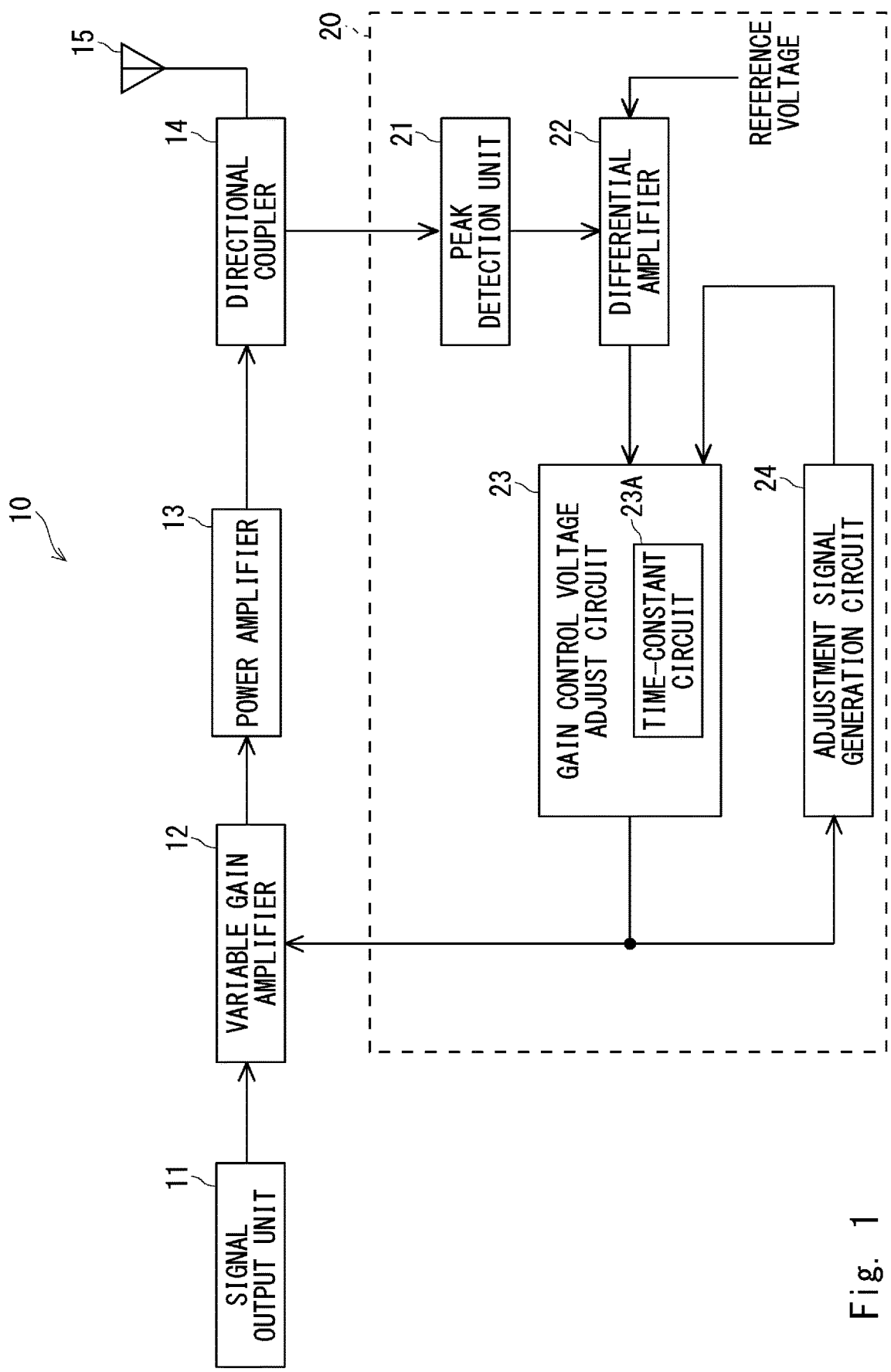
FIG. 1 is a block diagram showing an example of a radio transmitter according to a first embodiment.

FIG. 1 is a block diagram showing an example of a radio transmitter according to a first embodiment. In FIG. 1, a radio transmitter 10 includes a signal output unit (modulator) 11, a variable gain amplifier 12, a power amplifier 13, a directional coupler 14, an antenna 15, and a gain control device 20. The radio transmitter 10 is configured to be able to transmit a radio signal in CW (Continuous Wave) mode, FM (Frequency Modulation) mode, and SSB (Single Side Band) mode, for example. Hereinafter, the radio transmitter 10 in the CW mode is described as an example.

The signal output unit 11 outputs a high-frequency burst signal (which is hereinafter referred to simply as "burst signal"). The burst signal contains "amplitude increase part (ramp-up part)" where the amplitude increases from zero to a specified value with a certain slope and "steady part" where the amplitude is substantially constant at a specified value alternately in this order. By including the "amplitude increase part" in this burst signal, it is possible to prevent an increase in occupied bandwidth. The signal output unit 11 does not output the burst signal at key-up, and outputs the burst signal at key-down, for example. Note that this burst signal may contain, after the steady part, "amplitude decrease part (ramp-down part)" where the amplitude decreases from a specified value to zero with a certain slope.

The variable gain amplifier 12 amplifies the burst signal output from the signal output unit 11 by a gain depending on "gain control voltage" output from the gain control device 20, and outputs the amplified burst signal. The amplified burst signal output from the variable gain amplifier 12 is amplified with a specified gain by the power amplifier 13. The burst signal amplified by the power amplifier 13 is split by the directional coupler 14, and a part of the signal is emitted through the antenna 15, and the rest of the signal is input to the gain control device 20.

In FIG. 1, the gain control device 20 includes a peak detection unit 21, a differential amplifier 22, a gain control voltage adjust circuit 23, and an adjustment signal generation circuit 24.

The peak detection unit 21 includes a diode (not shown), for example, and rectifies the burst signal input through the directional coupler 14. Thus, pulsating flow is output from the peak detection unit 21 when the burst signal is input to the peak detection unit 21.

The output of the peak detection unit 21 and "reference voltage" are input to the differential amplifier 22. Then, the differential amplifier 22 amplifies a difference between the output of the peak detection unit 21 and the reference voltage and generates "control voltage", and outputs the generated "control voltage" to the gain control voltage adjust circuit 23. The output of the peak detection unit 21 corresponds to "actual transmission power", which is the actual transmission power of a radio signal transmitted by the radio transmitter 10. On the other hand, the "reference voltage" corresponds to "target transmission power" of the radio signal transmitted by the radio transmitter 10. Thus, the differential amplifier 22 generates "control voltage" depending on a difference between "actual transmission power" and "target transmission power" of the radio signal transmitted by the radio transmitter 10. Further, the "target transmission power" is the upper limit of transmission power in consideration of interference with another communication equipment or the like, for example. In this case, the gain control device 20 controls "gain control voltage" in such a way that the "actual transmission power" does not exceed the "target transmission power".

The gain control voltage adjust circuit 23 includes a time-constant circuit 23A. The "control voltage" generated in the differential amplifier 22 is input to the gain control voltage adjust circuit 23, and also "adjustment signal" is input from the adjustment signal generation circuit 24. When the "adjustment signal" is not input, the gain control voltage adjust circuit 23 outputs "gain control voltage" depending on the "control voltage" generated in the differential amplifier 22. On the other hand, when the "adjustment signal" is input, the gain control voltage adjust circuit 23 outputs an "adjusted gain control voltage" depending on the "adjustment signal" and the "control voltage" generated in the differential amplifier 22.

The adjustment signal generation circuit 24 outputs the "adjustment signal" to the gain control voltage adjust circuit 23 during "adjustment signal output period". Note that a certain burst signal output from the signal output unit 11 is referred to as "first burst signal", and a burst signal output from the signal output unit 11 before (e.g., immediately before) the first burst signal is referred to as "second burst signal". The "adjustment signal output period" for transmission of the "first burst signal" is a specified period before the first burst signal is output from the signal output unit 11 and where a burst signal is not output from the signal output unit 11. Further, the "adjustment signal" is a signal that is output from the adjustment signal generation circuit 24 to the gain control voltage adjust circuit 23 in order to make the "adjusted gain control voltage" output from the gain control voltage adjust circuit 23 closer to "target voltage". The "target voltage" is "gain control voltage" output from the gain control voltage adjust circuit 23, which corresponds to the "steady part" of the "second burst signal".

As described above, according to the first embodiment, the radio transmitter 10 having the above configuration of the gain control device 20 can set the gain control voltage output from the gain control voltage adjust circuit 23, which corresponds to the steady part of the second burst signal, as "target voltage". It is thereby possible to more accurately reproduce the gain control voltage corresponding to the steady part of the second burst signal during the adjustment signal output period for transmission of the first burst signal, which is different from Japanese Unexamined Patent Application Publication No. 2006-216995 described above. As a result, it is possible to output an appropriate gain control voltage at the start of transmission of the burst signal. Further, when the adjustment signal is input, the gain control voltage adjust circuit 23 outputs the "adjusted gain control voltage" depending on the adjustment signal and the control signal generated in the differential amplifier 22, and therefore there is no need for switching by a switch as described in the above-mentioned patent literature, thereby preventing noise or overshoot due to the switch.

<Specific Configuration Example of Gain Control Device>

Figure 2:
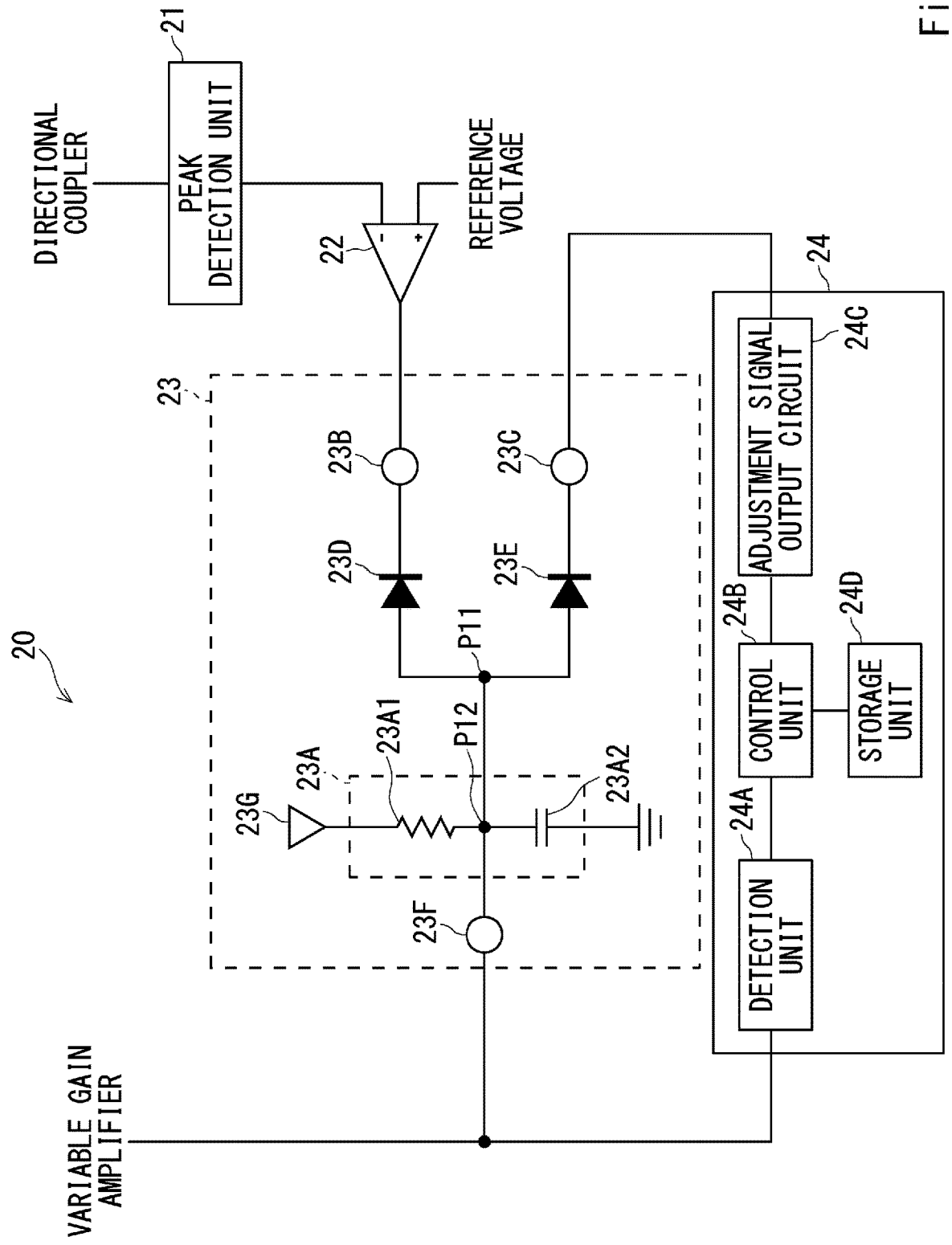
FIG. 2 is a view showing a specific configuration example of a gain control device in the radio transmitter according to the first embodiment.

FIG. 2 is a view showing a specific configuration example of the gain control device 20 in the radio transmitter 10 according to the first embodiment.

In the gain control device 20 of FIG. 2, the differential amplifier 22 is an inverting amplifier, where the output of the peak detection unit 21 is connected to its inverting input terminal (−), and the "reference voltage" is input to its non-inverting input terminal (+).

The gain control voltage adjust circuit 23 includes the time-constant circuit 23A, input terminals 23B and 23C, diodes 23D and 23E, an output terminal 23F, and a reference voltage source 23G. The time-constant circuit 23A includes a resistor 23A1 and a capacitor 23A2.

The input terminal (first input unit) 23B is connected to the output of the differential amplifier 22. The input terminal (second input unit) 23C is connected to the output of the adjustment signal generation circuit 24. Further, the output terminal (output unit) 23F is connected to the inputs of the variable gain amplifier 12 and the adjustment signal generation circuit 24.

The cathode of the diode 23D is connected to the input terminal 23B, and the anode of the diode 23D is connected to a node (first node) P11. The cathode of the diode 23E is connected to the input terminal 23C, and the anode of the diode 23E is connected to the node P11.

One end of the resistor 23A1 is connected to a node (second node) P12 on a connection line between the node P11 and the output terminal 23F, and the other end of the resistor 23A1 is connected to the reference voltage source 23G. Further, one end of the capacitor 23A2 is connected the node P12, and the other end of the capacitor 23A2 is connected the ground.

The adjustment signal generation circuit 24 includes a detection unit 24A, a control unit 24B, an adjustment signal output circuit 24C, and a storage unit 24D.

The detection unit 24A is an analog-to-digital converter, for example, and it detects the gain control voltage output from the gain control voltage adjust circuit 23, which corresponds to the steady part of the burst signal, and outputs the detected gain control voltage to the control unit 24B.

The control unit 24B is a processor (e.g., CPU: Central Processing Unit), for example, and it calculates a voltage value of the adjustment signal based on a difference between the "maximum value" of the gain control voltage output from the gain control voltage adjust circuit 23 and the gain control voltage detected in the detection unit 24A. The control unit 24B then stores the calculated voltage value of the adjustment signal into the storage unit 24D. Then, the control unit 24B reads the voltage value of the adjustment signal from the storage unit 24D and outputs it to the adjustment signal output circuit 24C during the adjustment signal output period. The "maximum value" of the gain control voltage output from the gain control voltage adjust circuit 23 is a value of the gain control voltage output from the gain control voltage adjust circuit 23 during a period which is other than the adjustment signal output period and where the burst signal is not output from the signal output unit 11. Specifically, immediately before the start of the adjustment signal output period, a radio signal is not transmitted, and therefore the output of the differential amplifier 22 reaches its maximum, and because the adjustment signal is also not output, the gain control voltage output from the gain control voltage adjust circuit 23 is the maximum value.

The adjustment signal output circuit 24C is a digital-to-analog converter, for example, and it generates the adjustment signal having a voltage value received from the control unit 24B and outputs the generated adjustment signal to the gain control voltage adjust circuit 23.

<Operation Example of Radio Transmitter>

An example of the operation of the radio transmitter having the above-described configuration is described hereinafter.

Comparative Example

Figure 3:
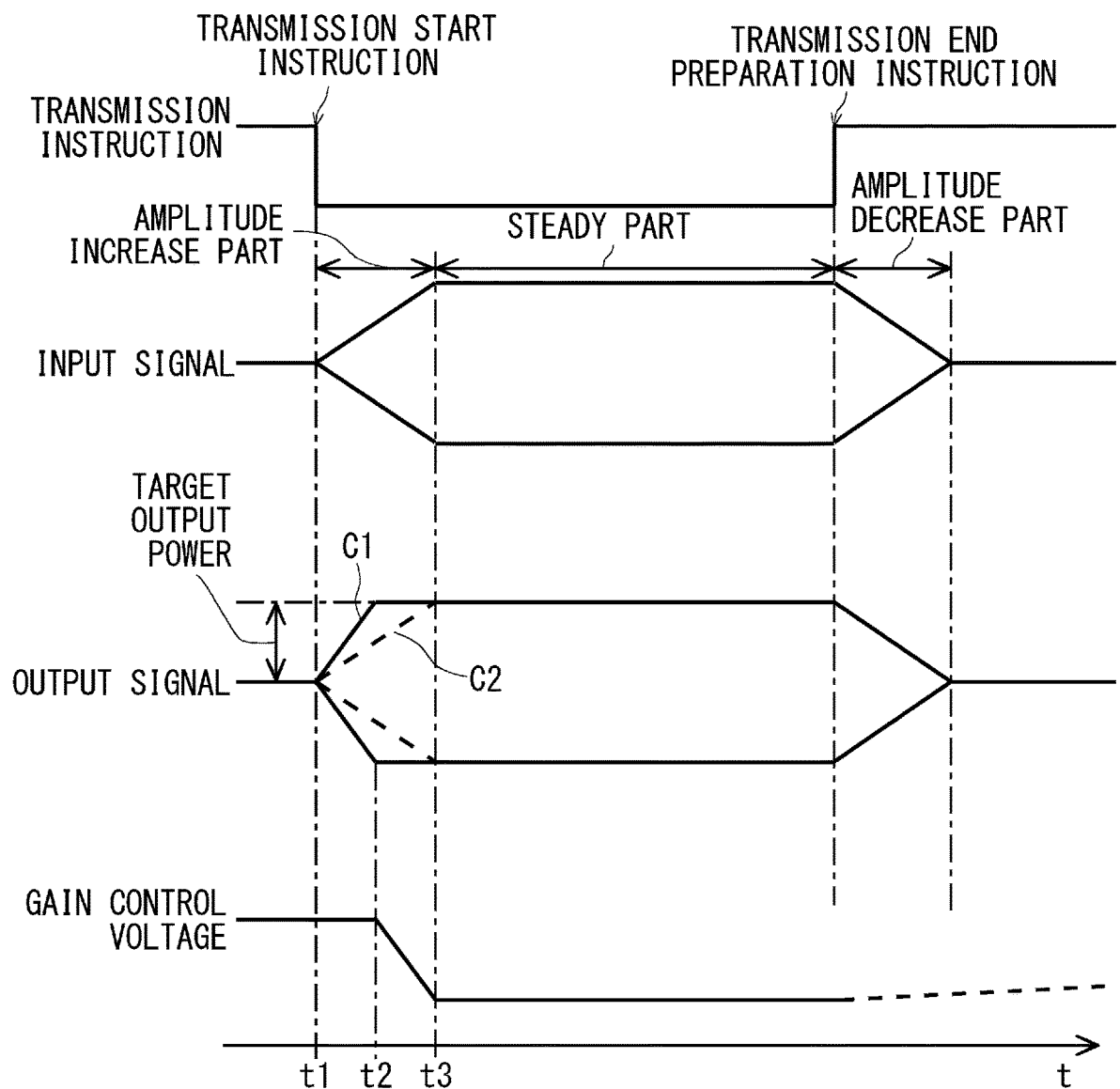
FIG. 3 is a view illustrating an operation in a comparative example.

First, the case where the gain control device 20 does not include the gain control voltage adjust circuit 23 and the adjustment signal generation circuit 24, which is the case where the output of the differential amplifier 22 is used as the gain control voltage without any change, is examined as a comparative example. FIG. 3 is a view illustrating the operation in the comparative example. In the top part of FIG. 3, a transmission instruction is shown. In the second top part of FIG. 3, the input to the variable gain amplifier 12, which is the burst signal output from the signal output unit 11, is shown. In the third top part of FIG. 3, the output of the variable gain amplifier 12, which is the burst signal amplified in the variable gain amplifier 12, is shown. In the bottom part of FIG. 3, the transition of the gain control voltage is shown.

Upon receiving a transmission start instruction at timing t1, i.e., at the falling edge of the transmission instruction, the signal output unit 11 starts the output of the burst signal. As shown in the second top part of FIG. 3, the burst signal contains the "amplitude increase part (ramp-up part)", the "steady part", and the "amplitude decrease part (ramp-down part)". The shape of the "amplitude increase part (ramp-up part)" and the "amplitude decrease part (ramp-down part)", which is the time length and the slope of amplitude change in each part, are defined in order to prevent an increase in occupied bandwidth as described above. Specifically, it is defined that the amplitude increases from zero to a specified value with a certain slope during the period from timing t1 to timing t3.

The variable gain amplifier 12 amplifies the burst signal output from the signal output unit 11 with a gain depending on the "gain control voltage" output from the gain control device 20, and outputs the amplified burst signal. In order to prevent an increase in occupied bandwidth, it is ideal that the burst signal output from the variable gain amplifier 12 also increases from zero to the "target output power" with a certain slope during the period from timing t1 to timing t3 as indicated by the changing process C2.

However, as described above, because a radio signal is not transmitted in the period before timing t1, the output of the differential amplifier 22 is maximum, and the gain control voltage is also maximum. Therefore, in the burst signal output from the variable gain amplifier 12, the amplitude increases with a sharp slope as indicated by the changing process C1, and it reaches the "target output power" at timing 2, which earlier than timing t3. Note that, although the amplitude of the burst signal output from the signal output unit 11 increases during the period from timing t2 to timing t3, the power of the burst signal output from the variable gain amplifier 12 is the target output power because the gain control voltage decreases from timing 2.

<Operation Example of Gain Control Device according to First Embodiment>

Figure 4:
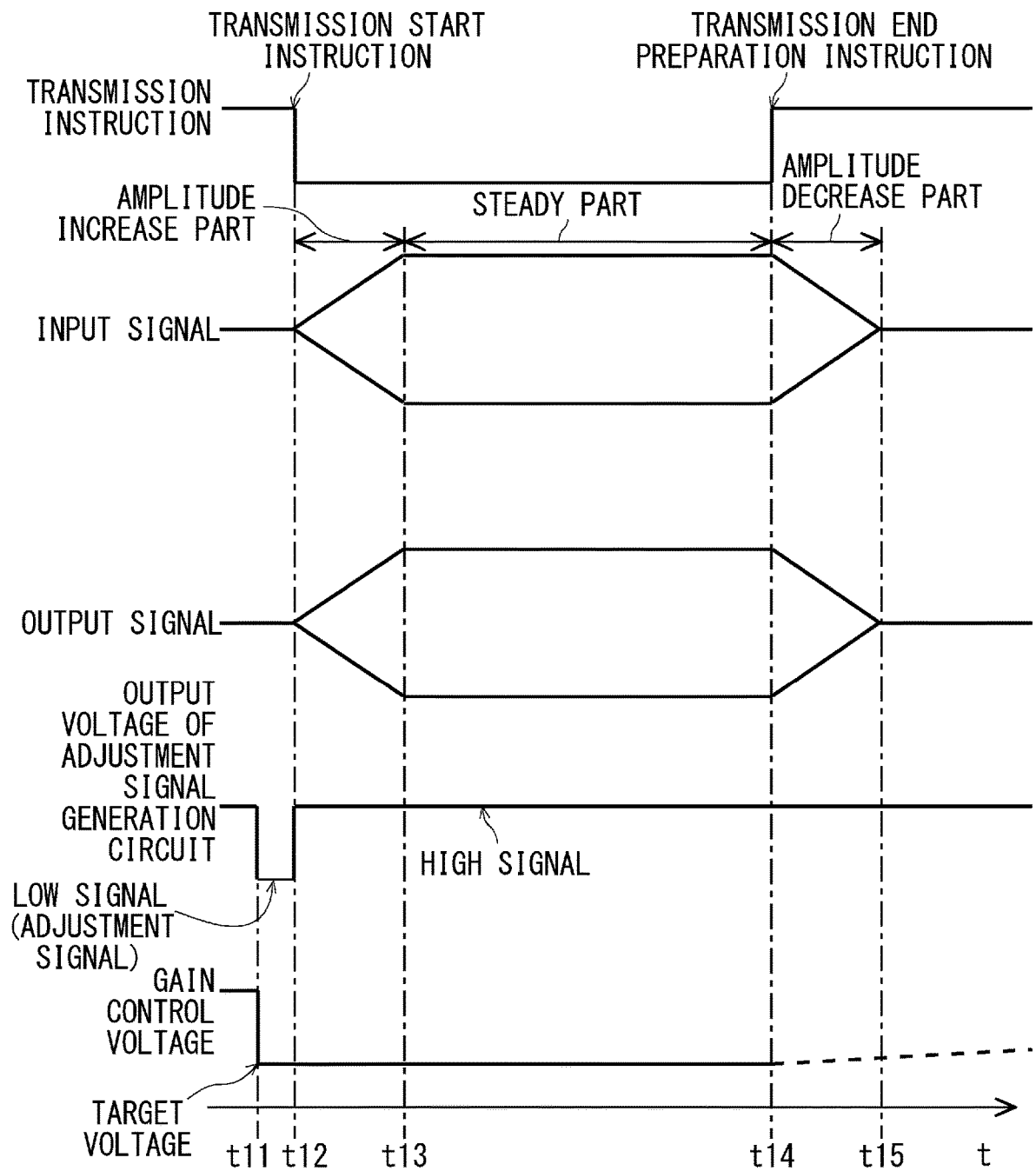
FIG. 4 is a view illustrating an operation of the gain control device according to the first embodiment.

FIG. 4 is a view illustrating the operation of the gain control device 20 shown in FIG. 2. In the top part of FIG. 4, a transmission instruction is shown. In the second top part of FIG. 4, the input to the variable gain amplifier 12, which is the burst signal output from the signal output unit 11, is shown. In the third top part of FIG. 4, the output of the variable gain amplifier 12, which is the burst signal amplified by the variable gain amplifier 12, is shown. In the fourth top part of FIG. 4, the output of the adjustment signal generation circuit 24 is shown. In the bottom part of FIG. 4, the transition of the gain control voltage is shown. In FIG. 4, a transmission start instruction is output at timing t12, and the period from timing t11, which is earlier than timing t12, to timing t12 is the "adjustment signal output period".

In the period before timing t11, a radio signal is not transmitted and the output of the differential amplifier 22 is maximum, and the potential of the input terminal 23B is higher than the potential of the node P12. Therefore, no current flows through the diode 23D. Further, because the period before timing t11 is not the adjustment signal output period, the adjustment signal generation circuit 24 outputs a High signal, and the potential of the input terminal 23C is higher than the potential of the node P12. Therefore, no current flows through the diode 23E. As a result, prior to timing t11, the gain control voltage adjust circuit 23 outputs the gain control voltage, which is the same as the voltage of the reference voltage source 23G, from the output terminal 23F.

When the adjustment signal output period begins at timing t11, the adjustment signal generation circuit 24 outputs a Low signal (adjustment signal), and the potential of the input terminal 23C becomes lower than the potential of the node P12. Thus, a current flows in the forward direction of the diode 23E, and the potential of the node P12 becomes lower. Therefore, the gain control voltage adjust circuit 23 outputs the gain control voltage (adjusted gain control voltage) that is lower than the voltage of the reference voltage source 23G from the output terminal 23F. The voltage value of the adjustment signal is a value based on the value detected by the detection unit 24A, and it is a value obtained by subtracting a voltage drop of the diode 23E from the gain control voltage detected by the detection unit 24A, for example. Then, the gain control voltage detected by the detection unit 24A corresponds to the steady part of the burst signal output from the signal output unit 11 before the burst signal shown in FIG. 4, which is the "target voltage". Since the adjustment signal is output during the adjustment signal output period, the gain control voltage output from the gain control voltage adjust circuit 23 at timing t12 where the transmission start instruction is output is equal to the "target voltage" or within an allowable error range. As a result, the output of the variable gain amplifier 12 shown in the third top part of FIG. 4 increases from timing t12 to timing t13, which is ideal, just like the input to the variable gain amplifier 12 shown in the second top part of FIG. 4.

Figure 5:
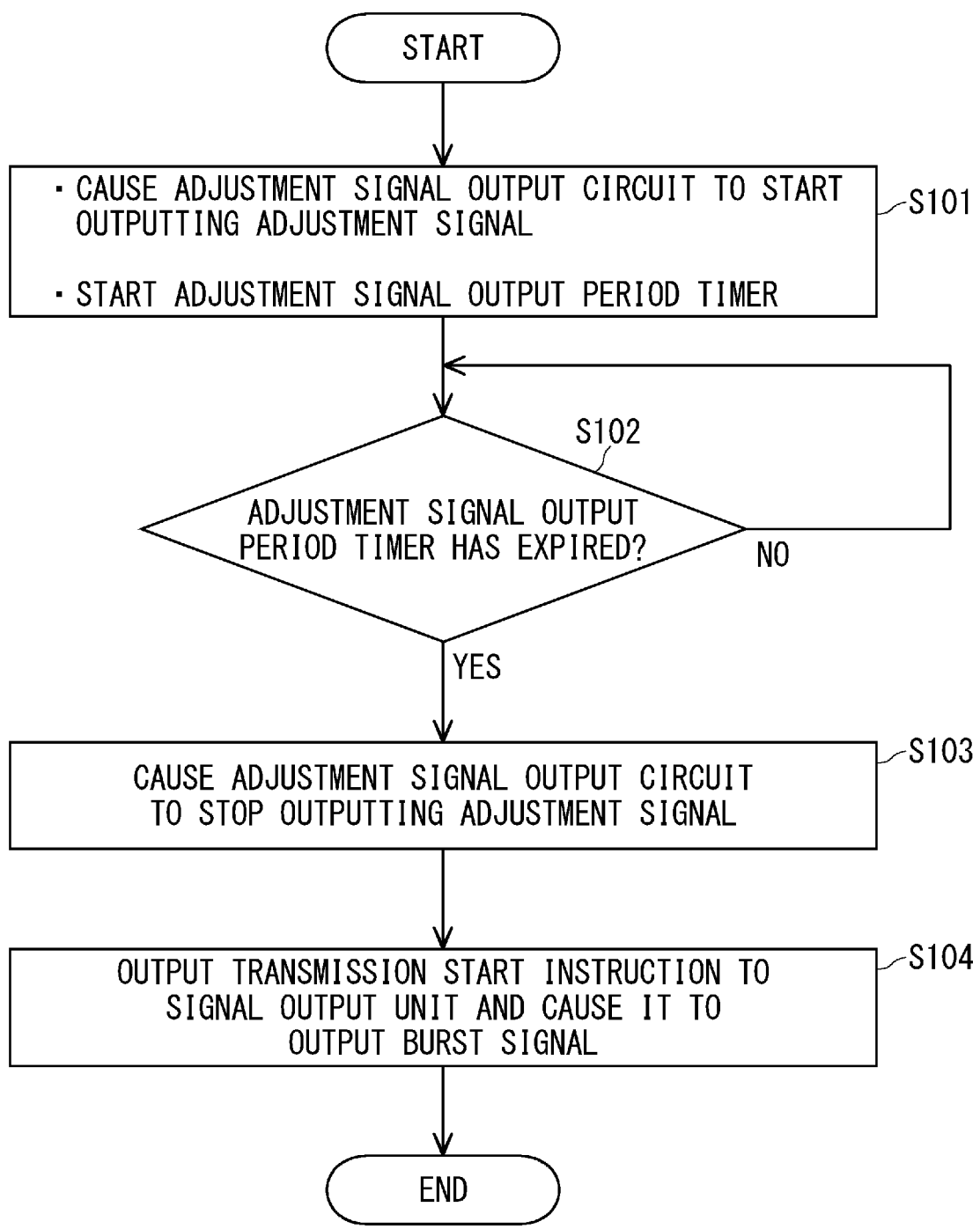
FIG. 5 is a flowchart showing an example of a processing operation of the gain control device at the start of transmission according to the first embodiment.

FIG. 5 is a flowchart showing an example of a processing operation of the gain control device 20 at the transmission start in the radio transmitter 10 according to the first embodiment.

When it comes to the timing of starting the adjustment signal output period, the control unit 24B causes the adjustment signal output circuit 24C to start outputting the adjustment signal and also starts an adjustment signal output period timer (Step S101).

The control unit 24B causes the adjustment signal output circuit 24C to keep outputting the adjustment signal until the adjustment signal output period timer has expired (No in Step S102), and when the adjustment signal output period timer expires (Yes in Step S102), the control unit 24B causes the adjustment signal output circuit 24C to stop outputting the adjustment signal (Step S103).

The control unit 24B outputs a transmission start instruction to the signal output unit 11 and thereby causes it to start outputting the burst signal (Step S104).

Referring back to FIG. 4, upon receiving a transmission end preparation instruction at timing t14, i.e., at the rising edge of a transmission instruction, the signal output unit 11 starts ramp-down of the burst signal. As the amplitude of the bust signal decreases, the output voltage of the differential amplifier 22 becomes higher, and the current flowing in the forward direction of the diode 23D decreases accordingly. The gain control voltage output from the gain control voltage adjust circuit 23 thereby increases gradually. The gain control voltage increases gradually because the time-constant circuit 23A has a shorter time constant in the direction of decreasing the gain control voltage and has a longer time constant in the direction of increasing the gain control voltage, thus acting for a long time in the direction of decreasing the gain control voltage. Therefore, at the time of transmission end preparation, the output of the variable gain amplifier 12 shown in the third top part of FIG. 4 decreases from timing t14 to timing t15, just like the input to the variable gain amplifier 12 shown in the second top part of FIG. 4, without using the adjustment signal.

Figure 6:
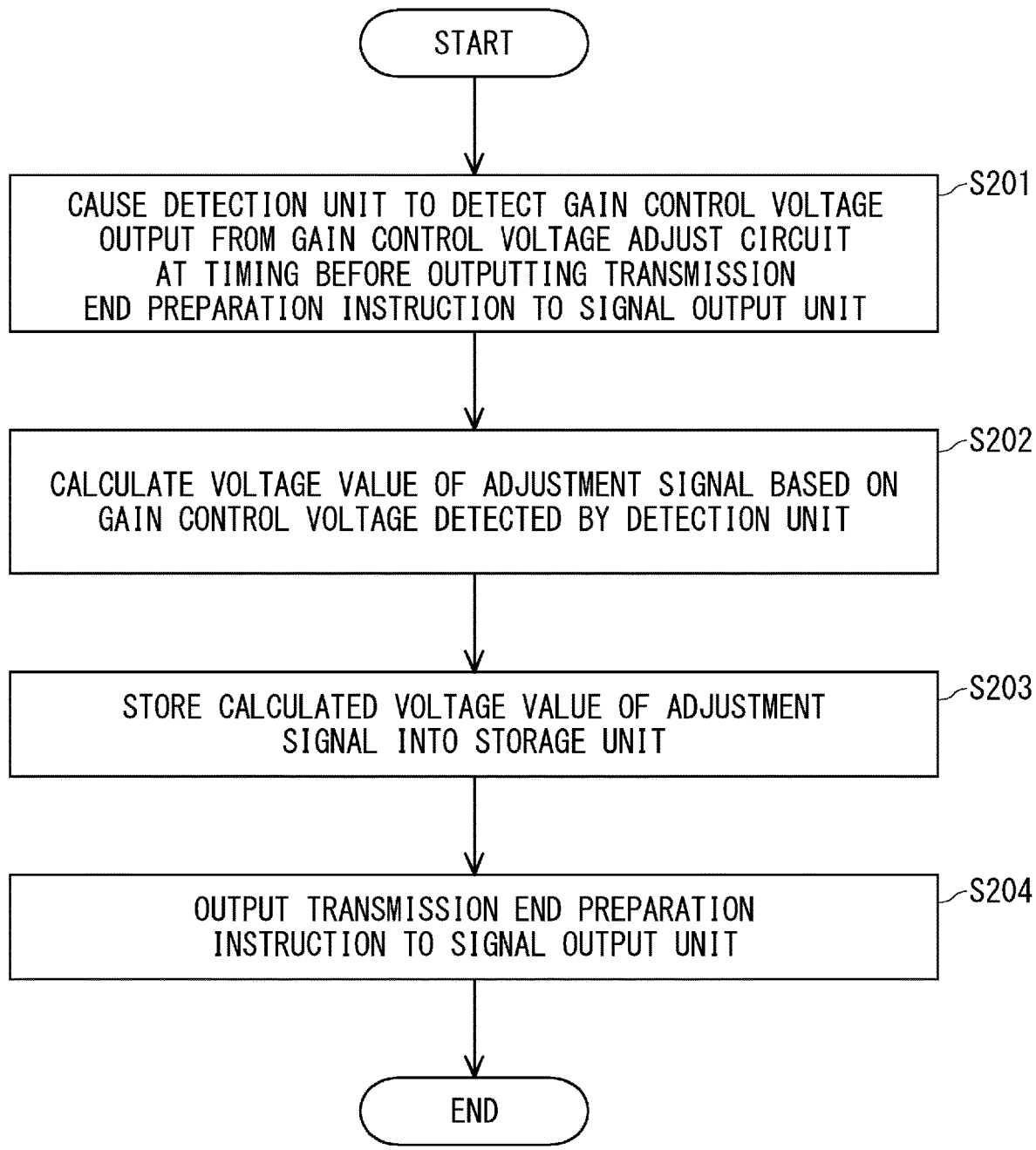
FIG. 6 is a flowchart showing an example of a processing operation of the gain control device during transmission end preparation according to the first embodiment.

FIG. 6 is a flowchart showing an example of a processing operation of the gain control device 20 during transmission end preparation in the radio transmitter 10 according to the first embodiment.

The control unit 24B causes the detection unit 24A to detect the gain control voltage output from the gain control voltage adjust circuit 23 at timing before outputting the transmission end preparation instruction to the signal output unit 11 (Step S201). The detection unit 24A can thereby detect the gain control voltage output from the gain control voltage adjust circuit 23, which corresponds to the steady part of the burst signal.

The control unit 24B calculates the voltage value of the adjustment signal based on the gain control voltage detected by the detection unit 24A (Step S202).

The control unit 24B stores the calculated voltage value of the adjustment signal into the storage unit 24D (Step S203).

The control unit 24B outputs the transmission end preparation instruction to the signal output unit 11 (Step S204).

Modified Example

Figure 7:
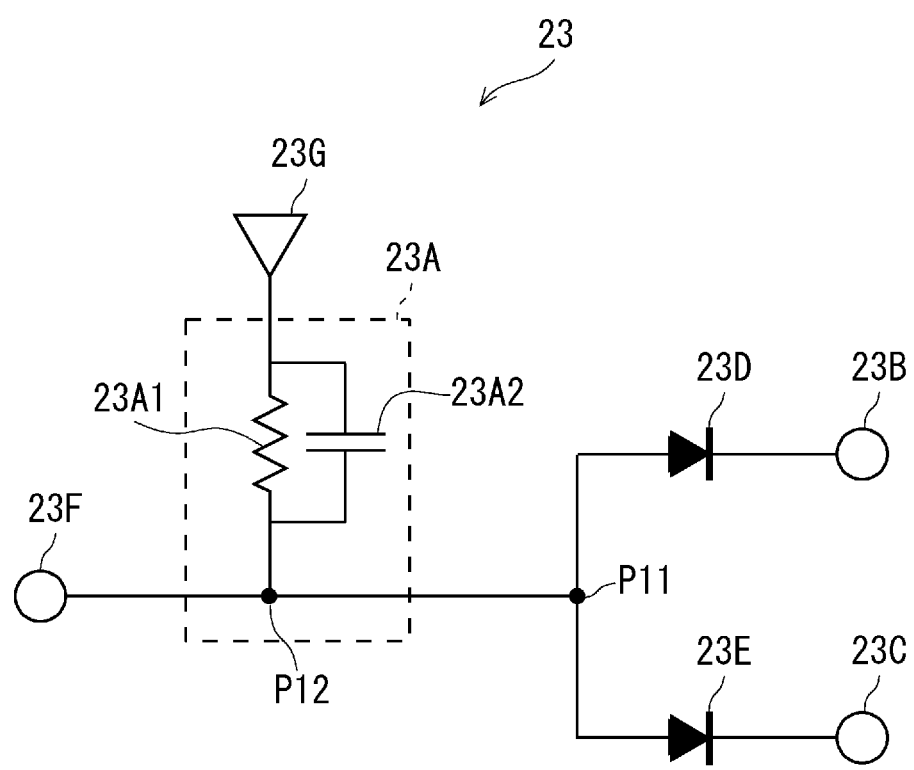
FIG. 7 is a view showing a modified example of a gain control voltage adjust circuit according to the first embodiment.

The following modification may be made to the gain control voltage adjust circuit 23 according to the first embodiment. FIG. 7 shows a modified example of the gain control voltage adjust circuit 23 according to the first embodiment. As shown in FIG. 7, the capacitor 23A2 may be connected in parallel with the resistor 23A1, and the both ends may be connected to the node P12 and the reference voltage source 23G, respectively, in the gain control voltage adjust circuit 23.

Second Embodiment

A second embodiment relates to a variation of the configuration of the gain control device 20 in the radio transmitter 10. Note that the configuration of the radio transmitter 10 according to the second embodiment is the same as that of the radio transmitter 10 according to the first embodiment, and therefore it is described with reference to FIG. 1.

<Specific Configuration Example of Gain Control Device>

Figure 8:
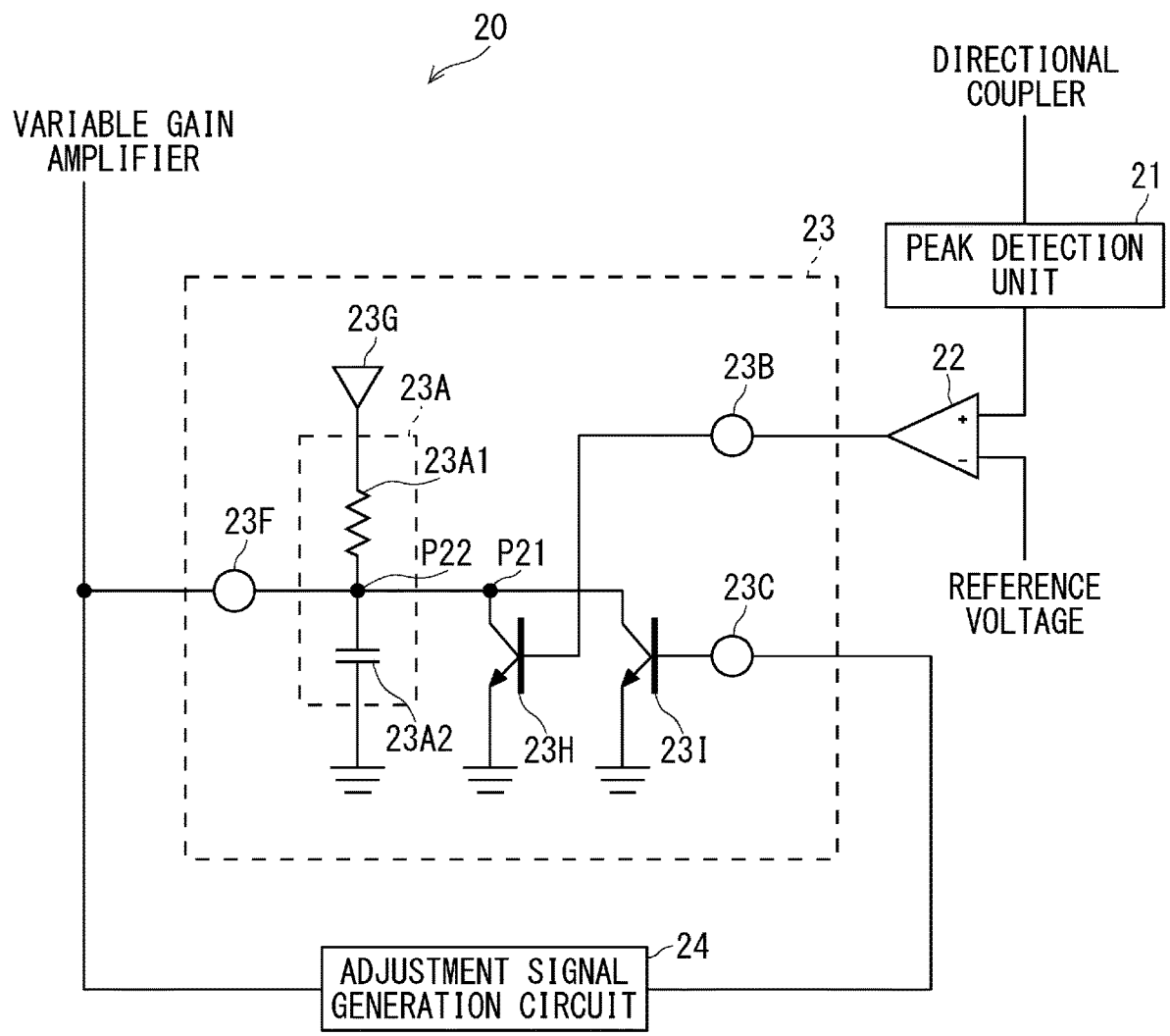
FIG. 8 is a view showing a specific configuration example of a gain control device according to a second embodiment.

FIG. 8 is a view showing a specific configuration example of the gain control device 20 in the radio transmitter 10 according to the second embodiment. The gain control device 20 of the second embodiment is different from the gain control device 20 of the first embodiment in the configuration of the gain control voltage adjust circuit 23 and also in that the differential amplifier 22 is a non-inverting amplifier rather than an inverting amplifier.

In the gain control device 20 of FIG. 8, the differential amplifier 22 is a non-inverting amplifier, where the output of the peak detection unit 21 is connected to its non-inverting input terminal (+), and the "reference voltage" is input to its inverting input terminal (−).

The gain control voltage adjust circuit 23 in the second embodiment includes the time-constant circuit 23A, the input terminals 23B and 23C, the output terminal 23F, the reference voltage source 23G, and transistors 23H and 23I.

The base of the transistor 23H is connected to the input terminal 23B, the emitter of the transistor 23H is connected to the ground, and the collector of the transistor 23H is connected to the node P21.

The base of the transistor 23I is connected to the input terminal 23C, the emitter of the transistor 23I is connected to the ground, and the collector of the transistor 23I is connected to a node P21.

One end of the resistor 23A1 is connected to a node P22 on a connection line between the node P21 and the output terminal 23F, and the other end is connected to the reference voltage source 23G. Further, one end of the capacitor 23A2 is connected to the node P22, and the other end is connected to the ground.

<Operation Example of Gain Control Device according to Second Embodiment>

Figure 9:
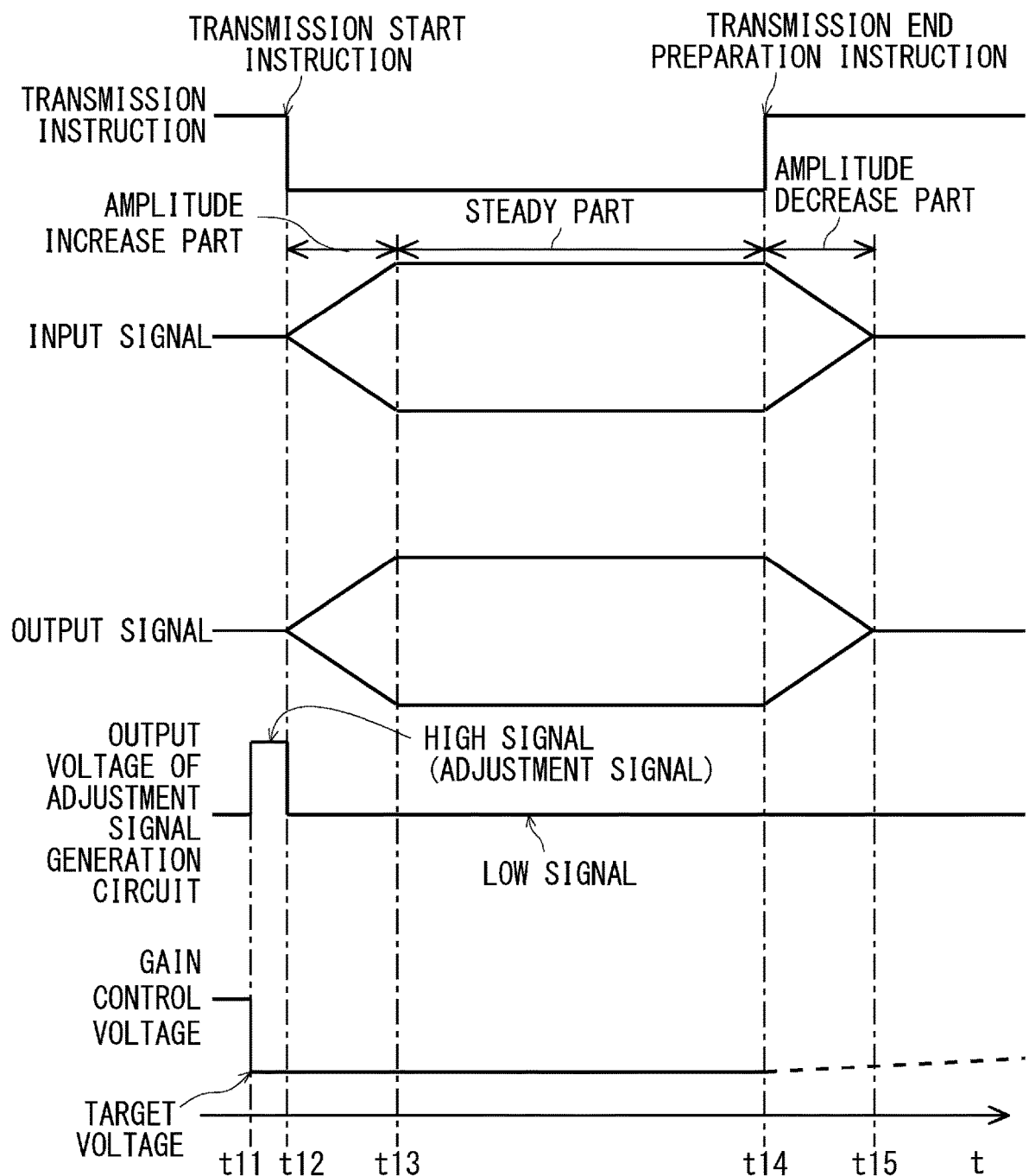
FIG. 9 is a view illustrating an operation of the gain control device according to the second embodiment.

FIG. 9 is a view illustrating the operation of the gain control device 20 shown in FIG. 8. In the top part of FIG.

9, a transmission instruction is shown. In the second top part of FIG. 9, the input to the variable gain amplifier 12, which is the burst signal output from the signal output unit 11, is shown. In the third top part of FIG. 9, the output of the variable gain amplifier 12, which is the burst signal amplified by the variable gain amplifier 12, is shown. In the fourth top part of FIG. 9, the output of the adjustment signal generation circuit 24 is shown. In the bottom part of FIG. 9, the transition of the gain control voltage is shown. In FIG. 9, a transmission start instruction is output at timing t12, and the period from timing t11, which is earlier than timing t12, to timing t12 is the "adjustment signal output period".

In the period before timing t11, a radio signal is not transmitted and the output of the differential amplifier 22, which is a non-inverting differential amplifier, is minimum, and therefore no current flows between the collector and the emitter of the transistor 23H. Further, because the period before timing t11 is not the adjustment signal output period, the adjustment signal generation circuit 24 outputs a Low signal, differently from the first embodiment, and therefore no current flows between the collector and the emitter of the transistor 23I. As a result, prior to timing t11, the gain control voltage adjust circuit 23 outputs the gain control voltage, which is the same as the voltage of the reference voltage source 23G, from the output terminal 23F.

When the adjustment signal output period begins at timing t11, the adjustment signal generation circuit 24 outputs a High signal (adjustment signal), and a current flows between the collector and the emitter of the transistor 23I, and the potential of the node P22 becomes lower. Therefore, the gain control voltage adjust circuit 23 outputs the gain control voltage (adjusted gain control voltage) that is lower than the voltage of the reference voltage source 23G from the output terminal 23F.

Upon receiving a transmission end preparation instruction at timing t14, i.e., at the rising edge of a transmission instruction, the signal output unit 11 starts ramp-down of the burst signal. As the amplitude of the bust signal decreases, the output voltage of the differential amplifier 22 becomes lower, and the current flowing between the collector and the emitter of the transistor 23H decreases accordingly.

The gain control voltage output from the gain control voltage adjust circuit 23 thereby increases gradually.

Modified Example

Figure 10:
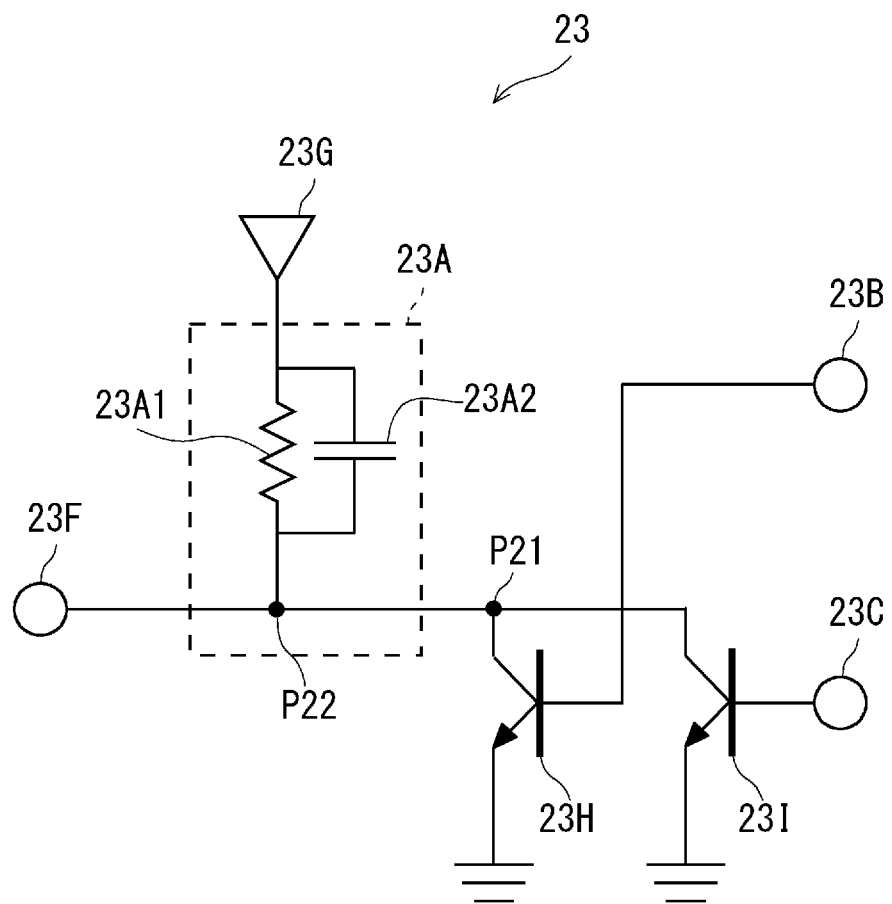
FIG. 10 is a view showing a modified example of a gain control voltage adjust circuit according to the second embodiment.

The following modification may be made to the gain control voltage adjust circuit 23 according to the second embodiment. FIG. 10 shows a modified example of the gain control voltage adjust circuit according to the second embodiment. As shown in FIG. 10, the capacitor 23A2 may be connected in parallel with the resistor 23A1, and the both ends may be connected to the node P22 and the reference voltage source 23G, respectively, in the gain control voltage adjust circuit 23.

Third Embodiment

A third embodiment relates to a control method of an adjustment signal generation circuit 31 of the gain control device 20 in the radio transmitter 10. In the adjustment signal output period, a corrected adjustment signal having a corrected voltage value obtained by adding a correction value to the previous voltage value of the adjustment signal is output to the gain control voltage adjust circuit until a difference between the adjusted gain control voltage output from the gain control voltage adjust circuit 23 and the "target voltage" becomes equal to or less than a specified value or until the adjustment signal output period ends.

<Configuration Example of Gain Control Device>

Figure 11:
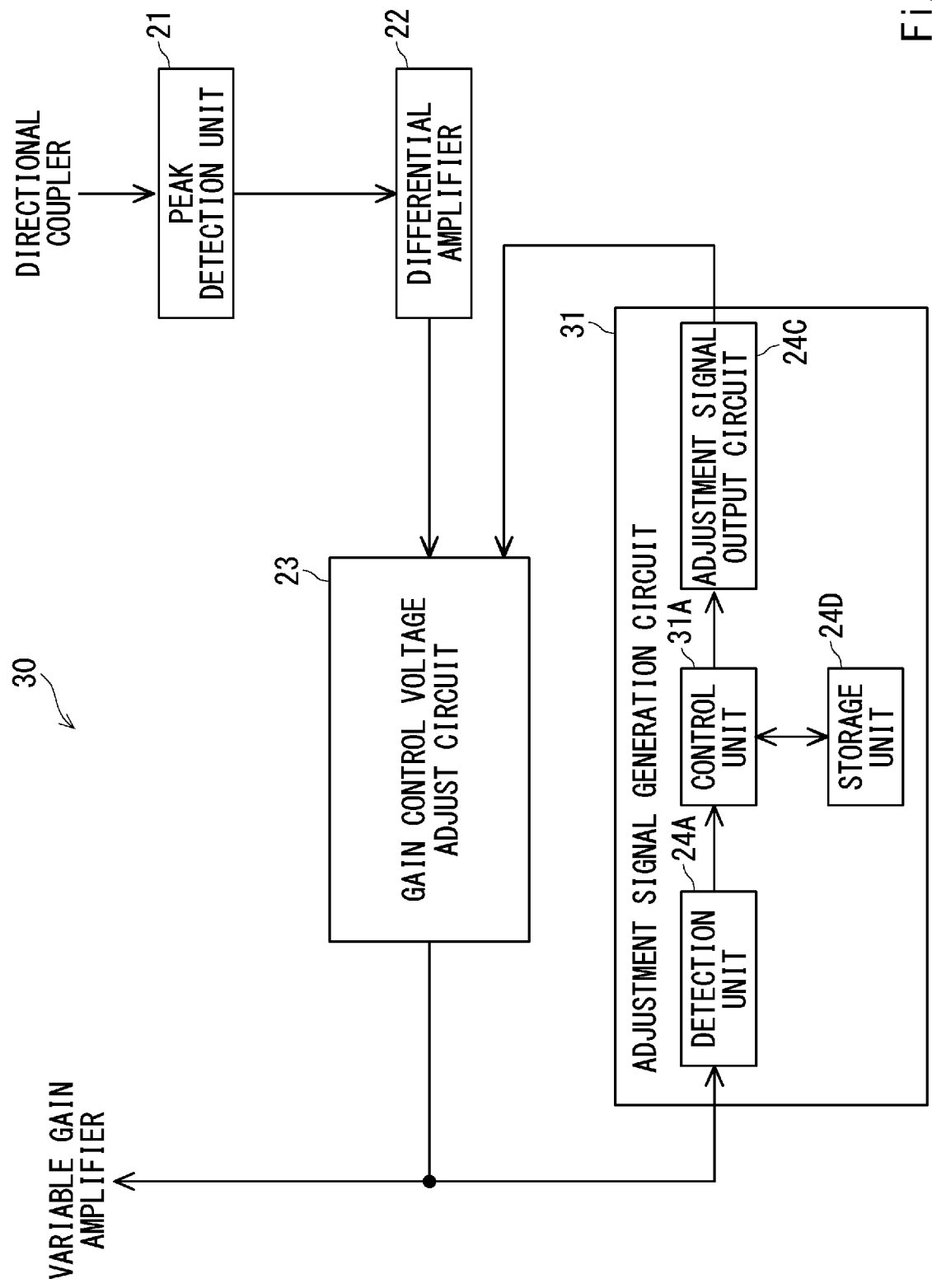
FIG. 11 is a block diagram showing an example of a gain control device according to a third embodiment.

FIG. 11 is a block diagram showing an example of the gain control device according to the third embodiment. Note that the configuration of the radio transmitter according to the third embodiment is the same as that of the radio transmitter 10 according to the first embodiment, and therefore it is described with reference to FIG. 1. Specifically, in the radio transmitter according to the third embodiment, the gain control device 20 in the radio transmitter 10 of FIG. 1 is replaced with a gain control device 30 of the third embodiment shown in FIG. 11.

In FIG. 11, the gain control device 30 includes a peak detection unit 21, a differential amplifier 22, a gain control voltage adjust circuit 23, and an adjustment signal generation circuit 31. A specific configuration of the gain control voltage adjust circuit 23 in the gain control device 30 may be the configuration described in the first embodiment or the configuration described in the second embodiment. When a specific configuration of the gain control voltage adjust circuit 23 is the configuration described in the first embodiment, the differential amplifier 22 is an inverting amplifier. When, on the other hand, a specific configuration of the gain control voltage adjust circuit 23 is the configuration described in the second embodiment, the differential amplifier 22 is a non-inverting amplifier. The adjustment signal generation circuit 31 outputs the adjustment signal in accordance with a specific configuration of the gain control voltage adjust circuit 23 as described in the first embodiment and the second embodiment.

In FIG. 11, the adjustment signal generation circuit 31 includes a detection unit 24A, an adjustment signal output circuit 24C, a storage unit 24D, and a control unit 31A.

The control unit 31A causes the detection unit 24A to detect the gain control voltage output from the gain control voltage adjust circuit 23, which corresponds to the steady part of the burst signal, just like the control unit 24B in the first embodiment and the second embodiment. Then, the control unit 31A calculates a voltage value of the adjustment signal and stores the voltage value of the adjustment signal into the storage unit 24D, just like the control unit 24B in the first embodiment and the second embodiment. The control unit 31A further stores the gain control voltage output from the gain control voltage adjust circuit 23 detected by the detection unit 24A, which corresponds to the steady part of the burst signal, into the storage unit 24D. This gain control voltage stored in the storage unit 24D is "target voltage".

When the adjustment signal output period begins, the control unit 31A causes the adjustment signal output circuit 24C to start outputting the adjustment signal having the voltage value stored in the storage unit 24D.

Then, during the adjustment signal output period, the control unit 31A repeatedly performs "correction processing of the adjustment signal" output from the adjustment signal output circuit 24C until "termination condition" is met. The "termination condition" is to satisfy one of the conditions that a difference between the adjusted gain control voltage output from the gain control voltage adjust circuit 23 and the "target voltage" becomes equal to or less than a specified value and that the adjustment signal output period ends.

For example, the "correction processing of the adjustment signal" when the adjustment signal having a first voltage value is output is as follows. Specifically, the control unit 31A causes the detection unit 24A to detect the gain control voltage output from the gain control voltage adjust circuit 23. Then, when a difference between the gain control voltage detected by the detection unit 24A and the "target voltage" is more than a specified value, the control unit 31A adds "specified correction value" to the first voltage value and thereby calculates a corrected voltage value. The control unit 31A then stores the corrected voltage value into the storage unit 24D and causes the adjustment signal output circuit 24C to output the adjustment signal having the corrected voltage value. In the next correction processing following this correction processing, the corrected voltage value stored in the storage unit 24D is handled as the first voltage value. Note that, when a difference between the gain control voltage detected by the detection unit 24A and the "target voltage" is equal to or less than a specified value, the control unit 31A ends the correction processing, causes the adjustment signal output circuit 24C to stop outputting the adjustment signal, and causes the signal output unit 11 to start outputting the burst signal. Further, when the adjustment signal output period ends before a difference between the gain control voltage detected by the detection unit 24A and the "target voltage" becomes equal to or less than a specified value also, the control unit 31A ends the correction processing, causes the adjustment signal output circuit 24C to stop outputting the adjustment signal, and causes the signal output unit 11 to start outputting the burst signal.

<Operation Example of Gain Control Device>

Figure 12:
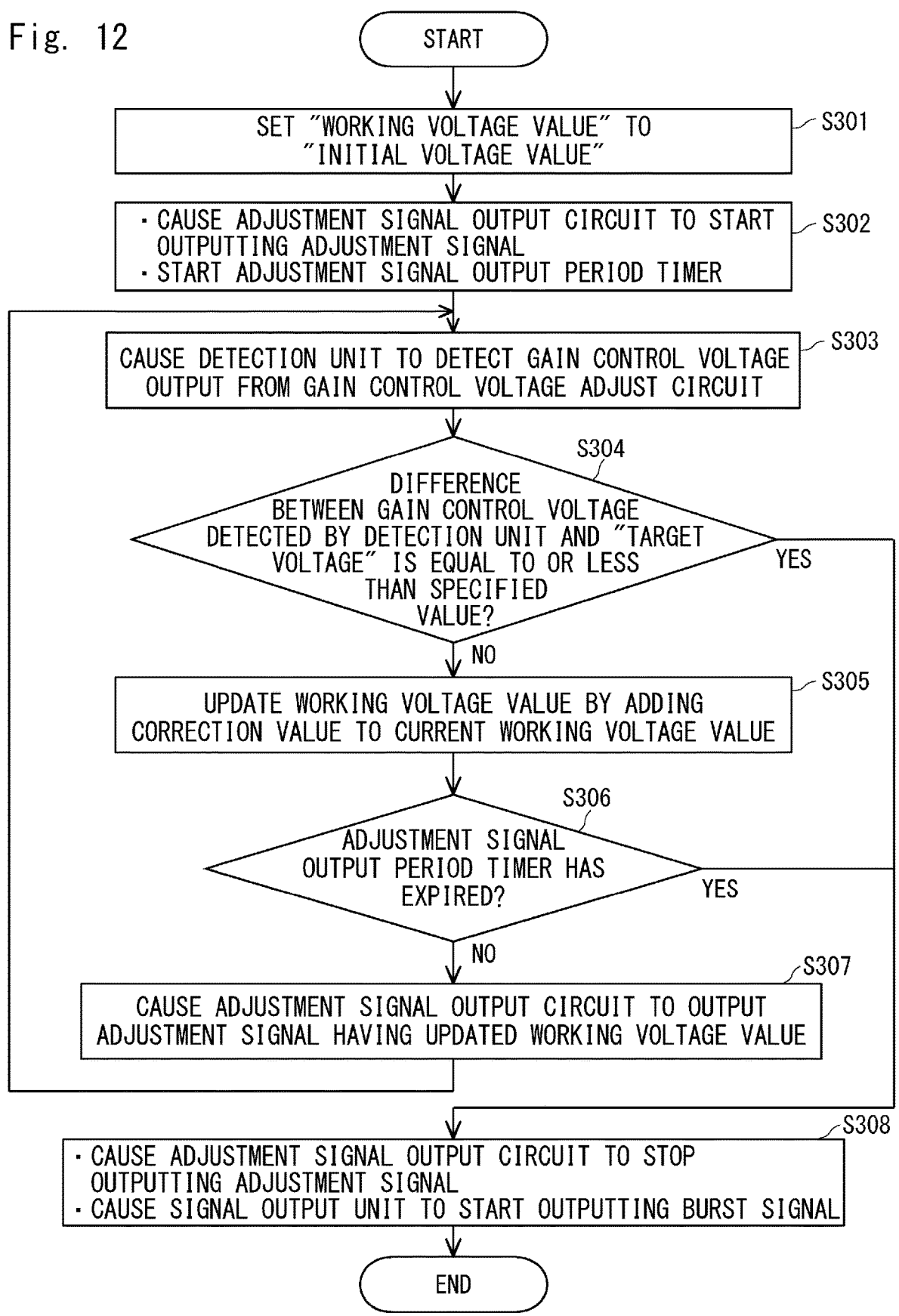
FIG. 12 is a flowchart showing an example of a processing operation of the gain control device at the start of transmission according to the third embodiment.

An operation example of the gain control device according to the third embodiment having the above-described configuration is described hereinafter. FIG. 12 is a flowchart showing an example of a processing operation of the gain control device at the start of transmission according to the third embodiment.

When it comes to the timing of starting the adjustment signal output period, the control unit 31A sets "working voltage value" to "initial voltage value" (Step S301). The "initial voltage value" is a voltage value calculated by the control unit 31A based on the gain control voltage ("target voltage value"), which corresponds to the steady part of a burst signal having been output from the signal output unit 11 before the burst signal to be output this time, and the "maximum value" of the gain control voltage, just like in the first embodiment and the second embodiment.

The control unit 31A causes the adjustment signal output circuit 24C to start outputting the adjustment signal using the working voltage value and also starts an adjustment signal output period timer (Step S302).

The control unit 31A causes the detection unit 24A to detect the gain control voltage output from the gain control voltage adjust circuit 23 (Step S303).

The control unit 31A determines whether a difference between the gain control voltage detected by the detection unit 24A and the "target voltage" is equal to or less than a specified value (Step S304).

When a difference between the gain control voltage detected by the detection unit 24A and the "target voltage" is more than a specified value (No in Step S304), the control unit 31A updates the working voltage value by adding a correction value to the current working voltage value (Step S305).

The control unit 31A determines whether the adjustment signal output period timer has expired or not (Step S306).

When the adjustment signal output period timer has not expired (No in S306), the control unit 31A causes the adjustment signal output circuit 24C to output the adjustment signal having the updated working voltage value (Step S307).

When a difference between the gain control voltage detected by the detection unit 24A and the "target voltage" is equal to or less than a specified value (Yes in Step S304), the control unit 31A causes the adjustment signal output circuit 24C to stop outputting the adjustment signal and causes the signal output unit 11 to start outputting the burst signal (Step S308). Note that, when the adjustment signal output period timer has expired (Yes in S306) also, the process proceeds to Step S308.

Figure 13:
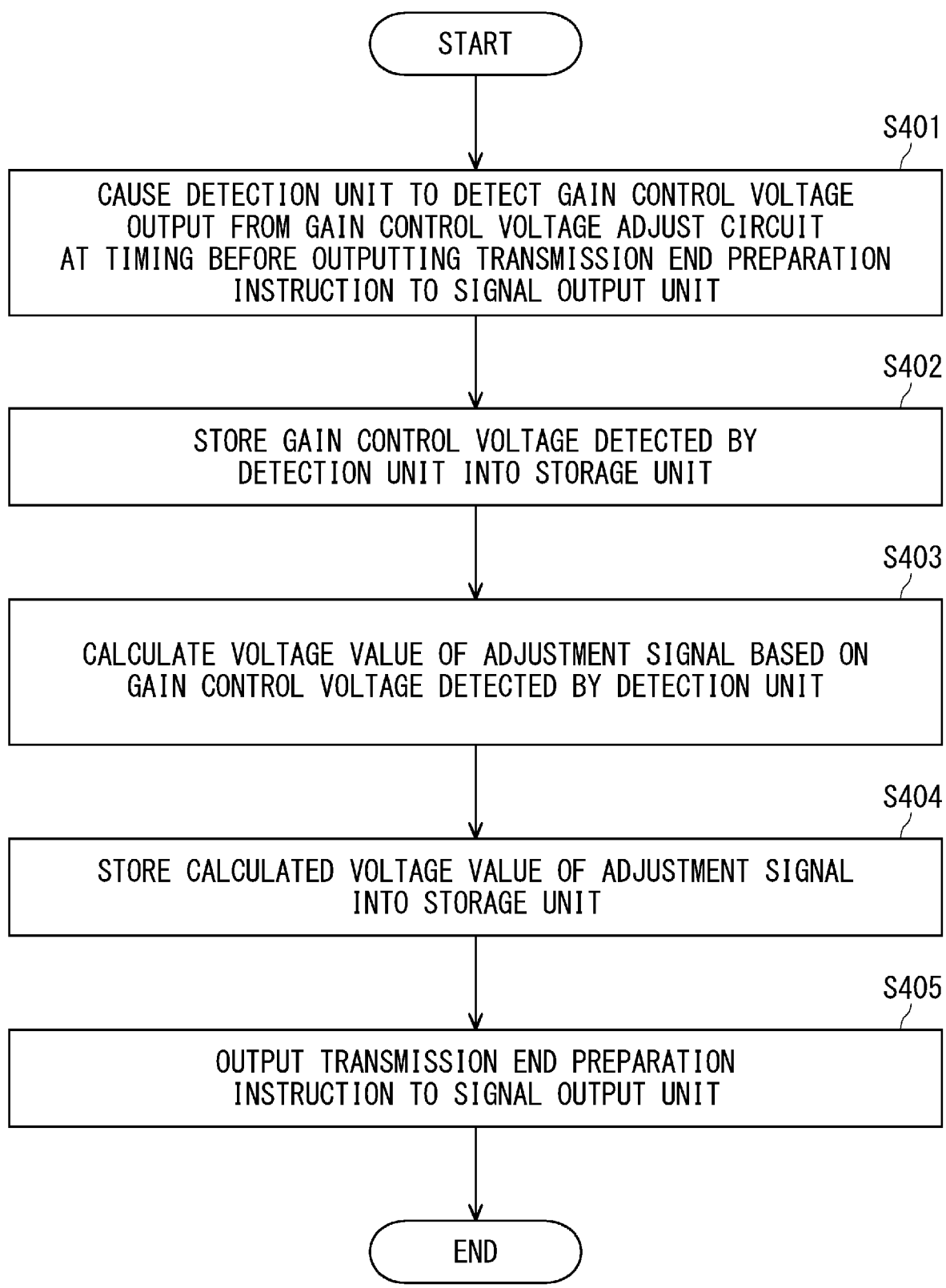
FIG. 13 is a flowchart showing an example of a processing operation of the gain control device during transmission end preparation according to the third embodiment.

FIG. 13 is a flowchart showing an example of a processing operation of the gain control device during transmission end preparation according to the third embodiment.

The control unit 31A causes the detection unit 24A to detect the gain control voltage output from the gain control voltage adjust circuit 23 at timing before outputting the transmission end preparation instruction to the signal output unit 11 (Step S401).

The control unit 31A stores the gain control voltage detected by the detection unit 24A into the storage unit 24D (Step S402). This gain control voltage stored in the storage unit 24D is the "target voltage".

The control unit 31A calculates a voltage value of the adjustment signal based on the gain control voltage detected by the detection unit 24A (Step S403).

The control unit 31A stores the calculated voltage value of the adjustment signal into the storage unit 24D (Step S404).

The control unit 31A outputs the transmission end preparation instruction to the signal output unit 11 (Step S405).

<Other Embodiments>

<1> Although, in the third embodiment, the "initial voltage value" is a voltage value calculated by the control unit 31A based on the gain control voltage ("target voltage value"), which corresponds to the steady part of the burst signal having been output from the signal output unit 11 before the burst signal to be output this time, and the "maximum value" of the gain control voltage, just like in the first embodiment and the second embodiment, it is not limited thereto. For example, the "initial voltage value" may be a predetermined voltage value. In this case also, it is possible to make the gain control voltage closer to the target voltage during the adjustment signal output period by repeating the above-described correction processing.

<2> In the gain control device 20, 30 of the first to third embodiments, when the power of the radio transmitter 10 turns from the OFF state to the ON state, when a transmission frequency is changed, or when a mode is changed, the adjustment signal output period may be provided for transmission of the second and subsequent burst signals without providing the adjustment signal output period for transmission of the burst signal to be output first form the signal output unit 11. In this case, the gain control device 20, 30 may reset (erase) the gain control voltage and the voltage value of the adjustment signal stored in the adjustment signal generation circuit 24 (the storage unit 24D) when the power of the radio transmitter 10 turns from the ON state to the OFF state, when an operation of changing a transmission frequency is done, or when an operation of changing a mode is done.

The first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A radio transmitter comprising:
a modulator configured to output a burst signal;
a variable gain amplifier configured to amplify the burst signal with a gain depending on a gain control voltage and output the amplified burst signal;
a differential amplifier configured to generate a control voltage depending on a difference between actual transmission power and target transmission power of a radio signal;
a gain control voltage adjust circuit configured to include a time-constant circuit and output a gain control voltage depending on the control voltage to the variable gain amplifier; and
an adjustment signal generation circuit configured to generate an adjustment signal based on the gain control voltage that is output when a second burst signal output before a first burst signal is output from the modulator, and output the generated adjustment signal to the gain control voltage adjust circuit during a specified period which is before the first burst signal is output from the modulator and during which no burst signal is output from the modulator,
wherein the gain control voltage adjust circuit outputs the gain control voltage depending on the generated control voltage when the adjustment signal is not input, and outputs the gain control voltage depending on the adjustment signal when the adjustment signal is input, and
the adjustment signal generation circuit outputs, to the gain control voltage adjust circuit during a period of outputting the adjustment signal, a corrected adjustment signal having a corrected voltage value obtained by adding a correction value to a voltage value of a previous adjustment signal until a difference between an adjusted gain control voltage output from the gain control voltage adjust circuit and a target voltage becomes equal to or less than a specified value or until the period of outputting the adjustment signal ends.

2. The radio transmitter according to claim 1, wherein the burst signal contains an amplitude increase part where an amplitude increases from zero to a specified value with a certain slope and a steady part where the amplitude is substantially constant at the specified value in this order, and
the adjustment signal generation circuit includes:
a detection unit configured to detect a gain control voltage corresponding to the steady part of the second burst signal;
a control unit configured to calculate a value of the adjustment signal based on the gain control voltage; and
an adjustment signal output circuit configured to generate an adjustment signal based on the calculated value and output the adjustment signal to the gain control voltage adjust circuit.

3. The radio transmitter according to claim 1, wherein the differential amplifier is an inverting amplifier, and
the gain control voltage adjust circuit includes:
a first input unit configured to be connected to an output of the differential amplifier;
a second input unit configured to be connected to an output of the adjustment signal generation circuit;
an output unit configured to output the gain control voltage and an adjusted gain control voltage;
a first diode configured to have a cathode connected to the first input unit and an anode connected to a first node;
a second diode configured to have a cathode connected to the second input unit and an anode connected to the first node;
a resistor configured to have one end connected to a second node on a connection line between the first node and the output unit and another end connected to a reference voltage source; and
a capacitor configured to have one end connected to the second node and another end connected to a ground.

4. The radio transmitter according to claim 1, wherein the differential amplifier is an inverting amplifier, and
the gain control voltage adjust circuit includes:
a first input unit configured to be connected to an output of the differential amplifier;
a second input unit configured to be connected to an output of the adjustment signal generation circuit;
an output unit configured to output the gain control voltage and an adjusted gain control voltage;
a first diode configured to have a cathode connected to the first input unit and an anode connected to a first node;
a second diode configured to have a cathode connected to the second input unit and an anode connected to the first node;
a resistor configured to have one end connected to a second node on a connection line between the first node and the output unit and another end connected to a reference voltage source; and
a capacitor configured to be connected in parallel with the resistor and have both ends respectively connected to the second node and the reference voltage source.

5. The radio transmitter according to claim 3, wherein the adjustment signal generation circuit outputs a signal inhibiting a forward current of the second diode during a period other than the period of outputting the adjustment signal, and
the adjustment signal generation circuit outputs the adjustment signal during the period of outputting the adjustment signal.

6. The radio transmitter according to claim 4, wherein the adjustment signal generation circuit outputs a signal inhibiting a forward current of the second diode during a period other than the period of outputting the adjustment signal, and
the adjustment signal generation circuit outputs the adjustment signal during the period of outputting the adjustment signal.

* * * * *